(12) United States Patent
Shan

(10) Patent No.: US 11,126,231 B2
(45) Date of Patent: Sep. 21, 2021

(54) DISPLAY DEVICE AND GROUNDING DEVICE THEREOF

(71) Applicant: HKC Corporation Limited, Shenzhen (CN)

(72) Inventor: Jianfeng Shan, Shenzhen (CN)

(73) Assignee: HKC Corporation Limited, Shenzhen (CN)

( * ) Notice: Subject to any disclaimer, the term of this patent is extended or adjusted under 35 U.S.C. 154(b) by 0 days.

(21) Appl. No.: 16/650,206

(22) PCT Filed: Sep. 25, 2018

(86) PCT No.: PCT/CN2018/107260
§ 371 (c)(1),
(2) Date: May 28, 2020

(87) PCT Pub. No.: WO2019/062696
PCT Pub. Date: Apr. 4, 2019

(65) Prior Publication Data
US 2020/0301485 A1   Sep. 24, 2020

(30) Foreign Application Priority Data

Sep. 27, 2017 (CN) .......................... 201710892002.X

(51) Int. Cl.
*G06F 1/16* (2006.01)
*G06F 1/18* (2006.01)
(Continued)

(52) U.S. Cl.
CPC ........ *G06F 1/189* (2013.01); *G02F 1/133308* (2013.01); *G02F 1/136286* (2013.01); *G06F 1/1656* (2013.01); *G02F 1/133334* (2021.01)

(58) Field of Classification Search
CPC .......................... G06F 1/1656; G02F 1/133334
(Continued)

(56) References Cited

U.S. PATENT DOCUMENTS 6,525,786 B1 * 2/2003 Ono ..................... G02F 1/13452
349/40
9,360,696 B1 * 6/2016 Ghali .................... G02F 1/1677
(Continued)

FOREIGN PATENT DOCUMENTS

| CN | 1544976 A | 11/2004 |
| CN | 104992956 A | 10/2015 |
| CN | 107688260 A | 2/2018 |

*Primary Examiner* — Anthony Q Edwards
(74) *Attorney, Agent, or Firm* — Wang Law Firm, Inc.

(57) ABSTRACT

The present disclosure illustrates a display device comprising a display panel; a frame made by insulative material, and configured to receive the display panel and comprising a through hole in communication with a top and a bottom thereof; a metal frame enclosing the frame, and comprising a hollow part configured to accommodate the display panel; a printed circuit board disposed under the frame and not in contact with the metal frame, and connected to the display panel via the through hole and a flexible cable; a conductive film attached with and electrically connected to a ground terminal of the printed circuit board and the metal frame; and a protective layer made by the insulative material and configured to cover on the printed circuit board and attach with a peripheral portion of the printed circuit board by adhesive material, so as to fix the printed circuit board for electrical shielding.

13 Claims, 16 Drawing Sheets

(51) Int. Cl.
*G02F 1/1333* (2006.01)
*G02F 1/1362* (2006.01)

(58) Field of Classification Search
USPC .................................................. 361/816, 818
See application file for complete search history.

(56) References Cited

U.S. PATENT DOCUMENTS

| | | | |
|---|---|---|---|
| 2009/0011197 A1* | 1/2009 | Matsuhira | G02F 1/133308 |
| | | | 428/192 |
| 2009/0067112 A1* | 3/2009 | Takabayashi | G02F 1/13452 |
| | | | 361/220 |
| 2012/0268686 A1* | 10/2012 | Lee | G02F 1/13452 |
| | | | 349/59 |
| 2013/0141664 A1* | 6/2013 | Toyoyama | G02F 1/133608 |
| | | | 349/59 |
| 2015/0192963 A1* | 7/2015 | Lo | G06F 1/1656 |
| | | | 361/679.3 |
| 2020/0089275 A1* | 3/2020 | Kuna | H02J 50/10 |
| 2020/0192431 A1* | 6/2020 | Shin | G06F 1/203 |

* cited by examiner

DISPLAY DEVICE AND GROUNDING DEVICE THEREOF

CROSS-REFERENCE TO RELATED APPLICATION

This application is a National Stage Application of PCT International Patent Application No. PCT/CN2018/107260 filed on Sep. 25, 2018, under 35 U.S.C. § 371, which claims priority to and the benefit of Chinese Patent Application No. 201710892002.X, filed on Sep. 27, 2017, and the disclosure of which is incorporated herein in its entirety by reference.

BACKGROUND OF THE INVENTION

1. Field of the Invention

The present disclosure relates to a display device, and more particularly to a grounding device of a printed circuit board disposed inside the display device.

2. Description of the Related Art

In recent years, a display device is a type of displayer having highest market share. Because of having advantages of light weight, thin and compact size, and power-saving, the display devices become popular in daily life and are widely applied in mobile telephones, notebook computers, digital recorders and tablet computers. The most popular display device is TFT-LCD device.

The TFT-LCD device uses non-self-luminance technology, which is different from that of the PDP device and the OLED device, so the TFT-LCD device requires a backlight source disposed inside. A driver circuit of the display device can convert control signals to output and switch voltages applied on liquid crystal molecules of a display panel, so as to change arrangement directions of the liquid crystal molecules, respectively. Light generated from the backlight source is emitted to pixel units of the display panel, and different transmittance values of the pixel units can display an image.

According to above-mentioned display principle of the display device, the arrangement directions of the liquid crystal molecules may be interfered easily by noise from external environment or a change in charges or electric field, which may result in abnormal image display. In order to prevent from being interfered, the printed circuit board must be isolated from external environment, and the signals transmitted in the printed circuit board also must be protected from being affected by cumulative charges of the printed circuit board which is hard to be discharged when the printed circuit board is isolated.

Some solutions are developed to solve these problems. The typical display device includes an outer metal frame, a frame, a display panel and a printed circuit board. In order to solve the problem caused by the cumulative charges of the printed circuit board, the conventional solution is to dispose a ground terminal on an edge of the printed circuit board adjacent to a side of the outer metal frame, and dispose a contact spring to electrically connect the ground terminal to the outer metal frame. The contact spring is fixed on the outer metal frame on by other screw, so that the cumulative charges of the printed circuit board can be moved to the outer metal frame, and discharged to the outside environment.

However, in the conventional solution, the outer metal frame is also electrically connected to the display panel, and cumulative charges may also affect the liquid crystal molecules, so there is still much room for improvement in the conventional solution.

SUMMARY OF THE INVENTION

In order to solve above-mentioned problem, the present disclosure is to provide a display device and a grounding device of a printed circuit board.

According to an embodiment, the present disclosure provides a display device comprising a display panel; a frame made by insulative material, wherein the display panel is disposed on the frame, and the frame comprises a through hole in communication with a top and a bottom thereof; a metal frame configured to enclose the frame, and comprising a hollow part configured to accommodate the display panel; a printed circuit board disposed under the frame and not in contact with the metal frame, and electrically connected to the display panel via the through hole and a flexible cable; a conductive film attached with and electrically connected to a ground terminal of the printed circuit board and the metal frame; and a protective layer made by the insulative material and configured to cover on the printed circuit board and attach with a peripheral portion of the printed circuit board by adhesive material, so as to fix the printed circuit board for electrical shielding.

Preferably, the ground terminal is disposed on a lower surface of the printed circuit board, or is extended from an edge of the printed circuit board to a side of the metal frame.

Preferably, the conductive film has single-sided adhesive property, and the protective layer is attached with the conductive film by adhesive material, to cover the conductive film.

Preferably, the conductive film has double-sided adhesive property, and the conductive film is directly attached with and covered by the protective layer.

Preferably, the conductive film with double-sided adhesive property is attached with the peripheral portion of the printed circuit board to serve as the adhesive material.

Preferably, the printed circuit board is attached with and covered by the protective layer through the conductive film with double-sided adhesive property.

According to an embodiment, the present disclosure provides a grounding device of a display device. The grounding device includes a metal frame configured to enclose a frame of the display device and comprising a hollow part configured to accommodate a display panel of the display device; a ground terminal disposed on a lower surface of a printed circuit board or extended from an edge of the printed circuit board to a side of the metal frame; a conductive film attached with and electrically connected to the ground terminal of the printed circuit board and the metal frame; and a protective layer made by insulative material and configured to cover the printed circuit board and attach with a peripheral portion of the printed circuit board by adhesive material, so as to fix the printed circuit board for electrical shielding. The printed circuit board is electrically connected to the display panel via a through hole of the frame and a flexible cable.

Preferably, the conductive film has single-sided adhesive property, and the protective layer is attached with the conductive film by adhesive material to cover the conductive film.

Preferably, the conductive film has double-sided adhesive property, and the conductive film is directly attached with and covered by the protective layer.

Preferably, the conductive film with double-sided adhesive property is attached on the peripheral portion of the printed circuit board to serve as the adhesive material.

Preferably, the printed circuit board is attached with and covered by the protective layer through the conductive film with double-sided adhesive property.

According to an embodiment, the present disclosure provides a display device comprising a display panel; a frame made by insulative material and comprising a through hole in communication with a top and a bottom thereof, wherein the display panel is disposed on the frame; a metal frame configured to enclose the frame and comprising a hollow part configured to accommodate the display panel; a printed circuit board disposed under the frame and not in contact with the metal frame; a conductive part disposed on an upper surface of the printed circuit board and mounted in the through hole, and electrically connected to the printed circuit board, and comprising a flexible cable electrically connected to the display panel via the through hole, so as to electrically connect the printed circuit board to the display panel; a conductive film attached with and electrically connected to a ground terminal of the printed circuit board and the metal frame; and a protective layer made by the insulative material and configured to cover the printed circuit board and attach with a peripheral portion of the printed circuit board by adhesive material, so as to fix the printed circuit board for electrical shielding.

Preferably, the ground terminal is disposed on a lower surface of the printed circuit board.

Preferably, the ground terminal is extended from an edge of the printed circuit board to a side of the metal frame.

Preferably, the conductive film has single-sided adhesive property.

Preferably, the protective layer is attached with the conductive film by adhesive material, to cover the conductive film.

Preferably, the conductive film has double-sided adhesive property.

Preferably, the conductive film is directly attached with and covered by the protective layer.

Preferably, the conductive film with double-sided adhesive property is attached with the peripheral portion of the printed circuit board to serve as the adhesive material.

Preferably, the printed circuit board is attached with and covered by the protective layer through the conductive film with double-sided adhesive property.

The liquid crystal display device and the grounding device of the present disclosure can improve the conventional structure including the screw and the contact spring and reduced the size of the structure, so as to make the liquid crystal display device lighter and more compact. Furthermore, connecting the flexible cable to the display panel via the through hole without passing around the outside of the metal frame, so as to prevent signals from being interfered.

BRIEF DESCRIPTION OF THE DRAWINGS

The structure, operating principle and effects of the present disclosure will be described in detail by way of various embodiments which are illustrated in the accompanying drawings.

DETAILED DESCRIPTION OF THE PREFERRED EMBODIMENTS

Figure 1:
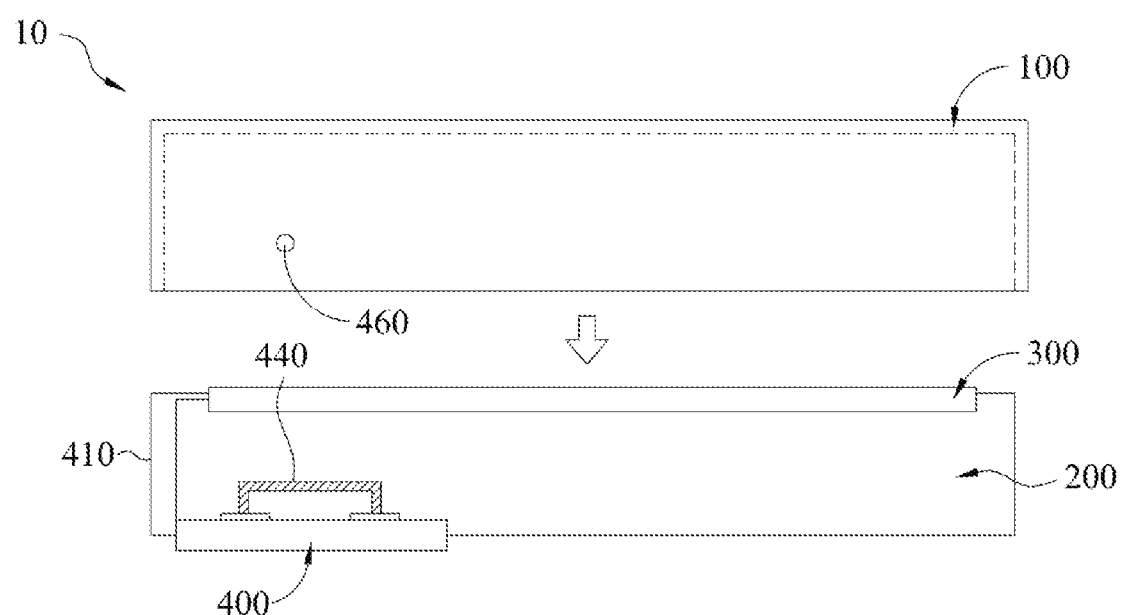
FIG. 1 is a schematic view of a circuit board of a display device grounded by an outer metal frame.

The following embodiments of the present disclosure are herein described in detail with reference to the accompanying drawings. These drawings show specific examples of the embodiments of the present disclosure. It is to be understood that these embodiments are exemplary implementations and are not to be construed as limiting the scope of the present disclosure in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be understood that when an element or layer is referred to as being "on," "connected to" or "coupled to" another element or layer, it can be directly on, connected or coupled to the other element or layer, electrically connected or coupled to the other element or layer, mechanically connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be understood to imply the inclusion of stated elements but not the exclusion of any other elements.

FIG. 1 shows a part of the conventional solution for the aforementioned problems. The typical the display device 10 includes an outer metal frame 100, a frame 200, a display panel 300 and a printed circuit board 400. The display panel 300 is disposed on an upper surface of the frame 200, and the printed circuit board 400 is disposed on a lower surface of the frame 200. The display panel 300 and the frame 200 are electrically connected to each other through a flexible cable 510. The outer metal frame 100 is mounted, from up to down, on an outer side of the frame 200, and includes a hollow part exposing the display panel 300.

Figure 2:
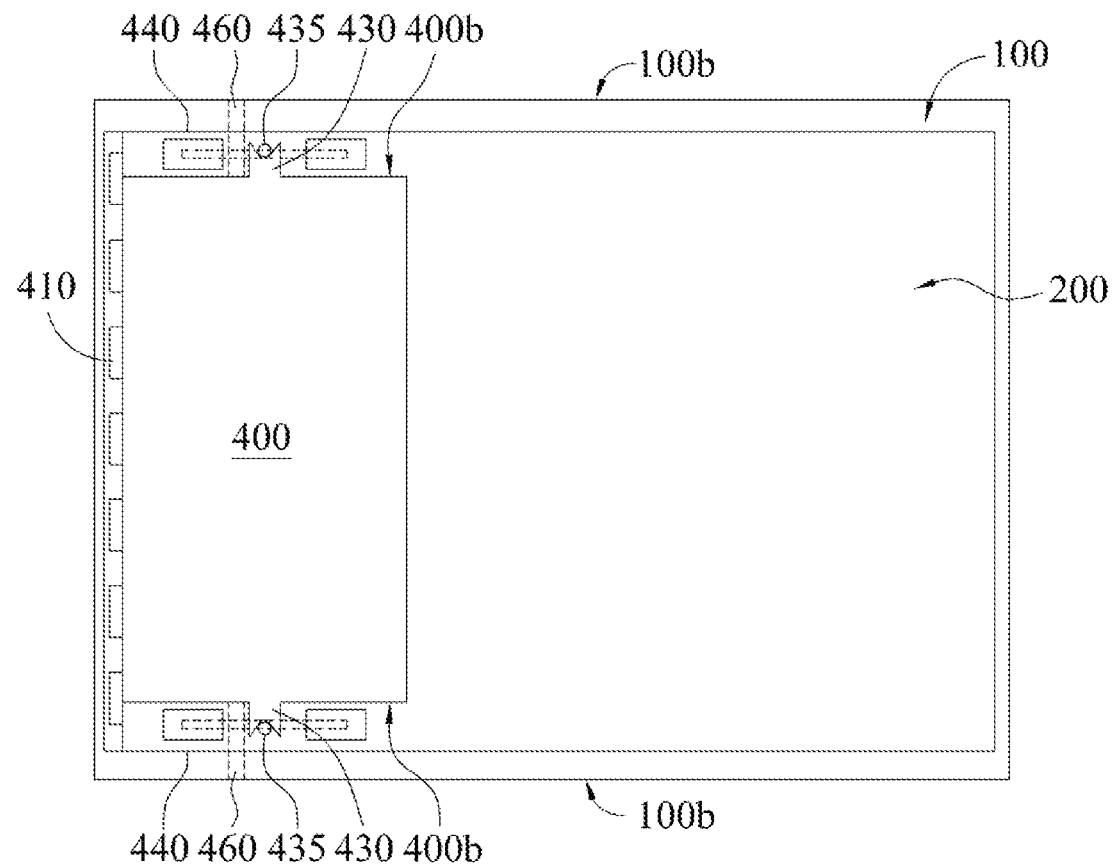
FIG. 2 is a schematic structural view of a bottom part of the display device shown in FIG. 1.

Please refer to FIG. 2. In order to prevent the problem caused by the cumulative charges of the printed circuit board 400, a ground terminal 430 is disposed on an edge of the printed circuit board 400 adjacent to the side of the outer metal frame 100, and the ground terminal 430 is fixed on the frame 200 on by a screw 435. A contact spring 440 is disposed to electrically connect the ground terminal 430 to the outer metal frame 100. The contact spring 440 is also fixed on the outer metal frame 100 by other screw which is not shown in figures. According to this structure, the cumulative charges of the printed circuit board 400 can be moved to the outer metal frame 100 through the contact spring 440, and discharged to the outside environment.

However, in the conventional solution, the outer metal frame is also electrically connected to the display panel, so the cumulative charges may also affect arrangement of the liquid crystal molecules. Compared with conventional solution, the structure of the present disclosure can prevent the arrangement of the liquid crystal molecules from being interfered.

Figure 3A:
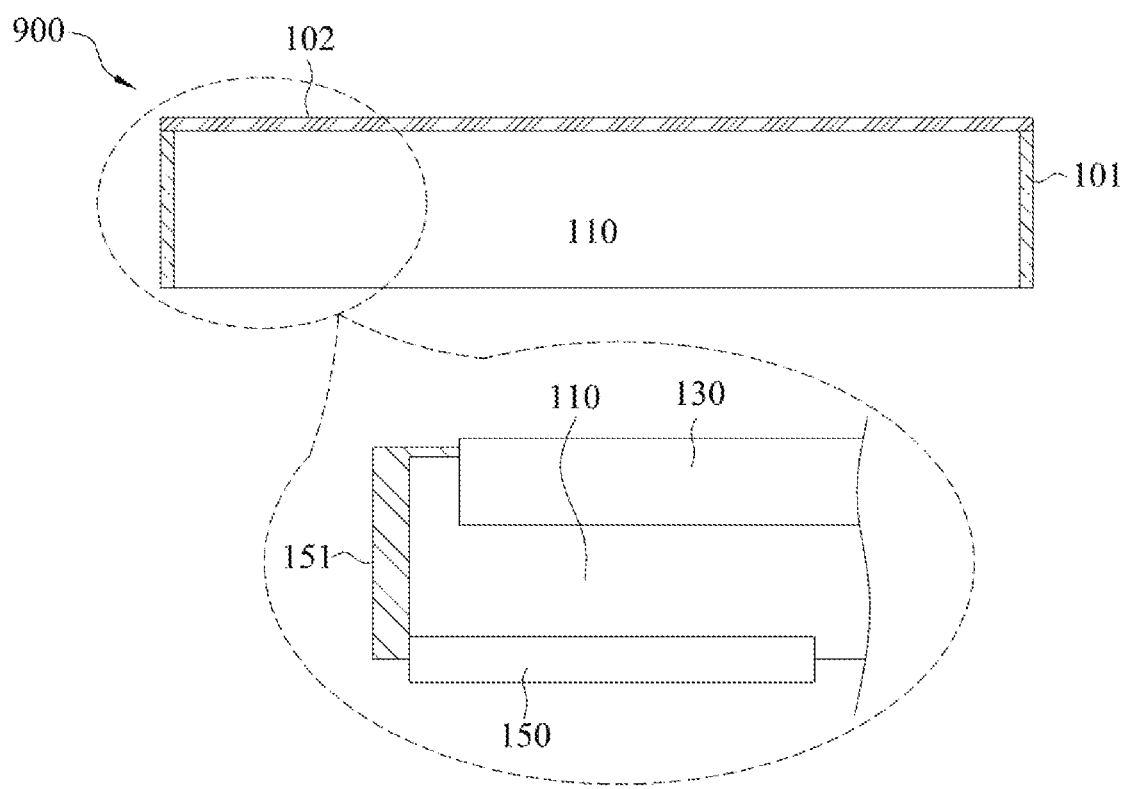
FIG. 3A is a schematic structural view of a liquid crystal display device of an embodiment of the present disclosure, and a schematic view of an internal structure boxed by dashed line.

Please refer to FIG. 3A. In a display device of an embodiment of the present disclosure, the display device 900 has a display panel 130. The display panel 130 is disposed on a frame 110. Optionally, the frame 110 can be made by any insulative material which is able to support other device without deformation, but the present disclosure is not limited thereto. The metal side frame 101 can be disposed on four side walls of the frame 110. Preferably, the metal side frame 101 can be directly fixed on the four side walls of the frame 110, or the metal side frame 101 can be spaced apart from the frame 110 to provide an accommodation space for other circuits or components. The metal side frame 101 can be fixed relative to the frame 110 by other manners. The protective top side frame 102 is disposed above the frame 110 and the display panel 130, Optionally, the protective top side frame 102 can be made by any the insulative material which is able to support other device without deformation, but the present disclosure is not limited thereto. The protective top side frame 102 has a hollow part to expose the display panel 130. The area of the hollow part is smaller than the display panel 130. When the protective top side frame 102 is disposed above the frame 110 and the display panel 130, the display panel on the frame 110 can be fixed more stably. The protective top side frame 102 can be fixed on the frame 110 by any appropriate manner, for example, the protective top side frame 102 can be directly adhered with the frame 110 by adhesive material, or the protective top side frame 102 and the metal side frame 101 can include connection members to fix the protective top side frame 102 relative to the metal frame 103, and then the protective top side frame 102 is fixed on the frame 110; however, the present disclosure is not limited to above-mentioned examples.

The present disclosure is not limited to these examples. In other embodiment, the metal frame 103 formed integrally can be used to replace the metal side frame 101 and the protective top side frame 102, and the detailed illustration will be described below; however, the present disclosure is not limited thereto.

Figure 3B:
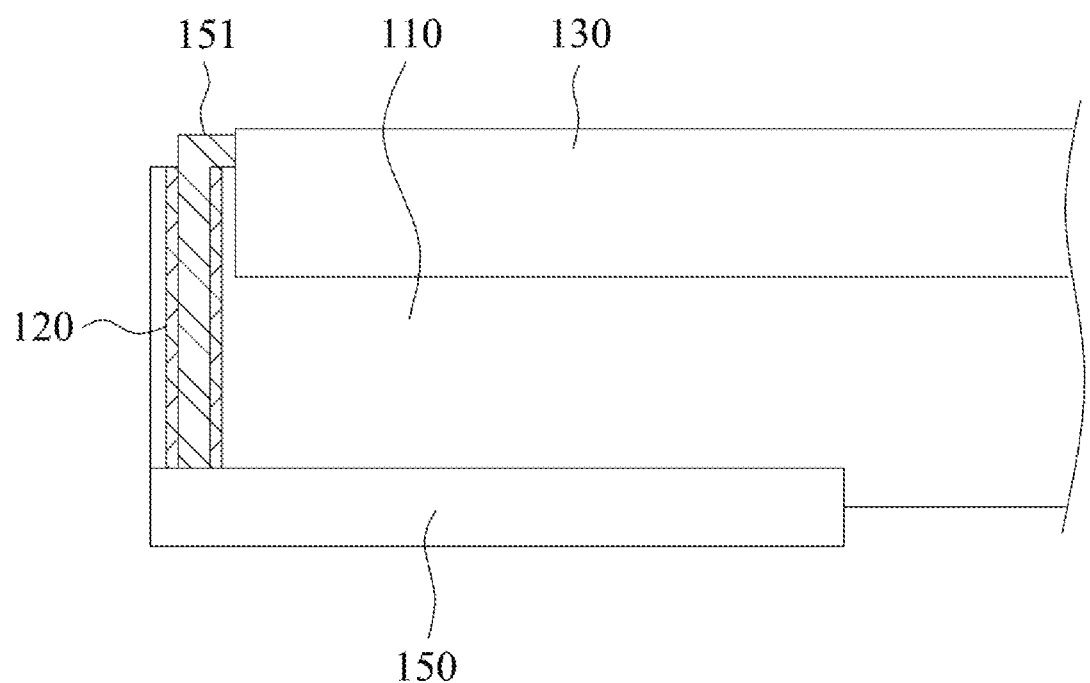
FIGS. 3B and 3C are schematic structural views of a part of a liquid crystal display device of an embodiment of the present disclosure.
Figure 3C:
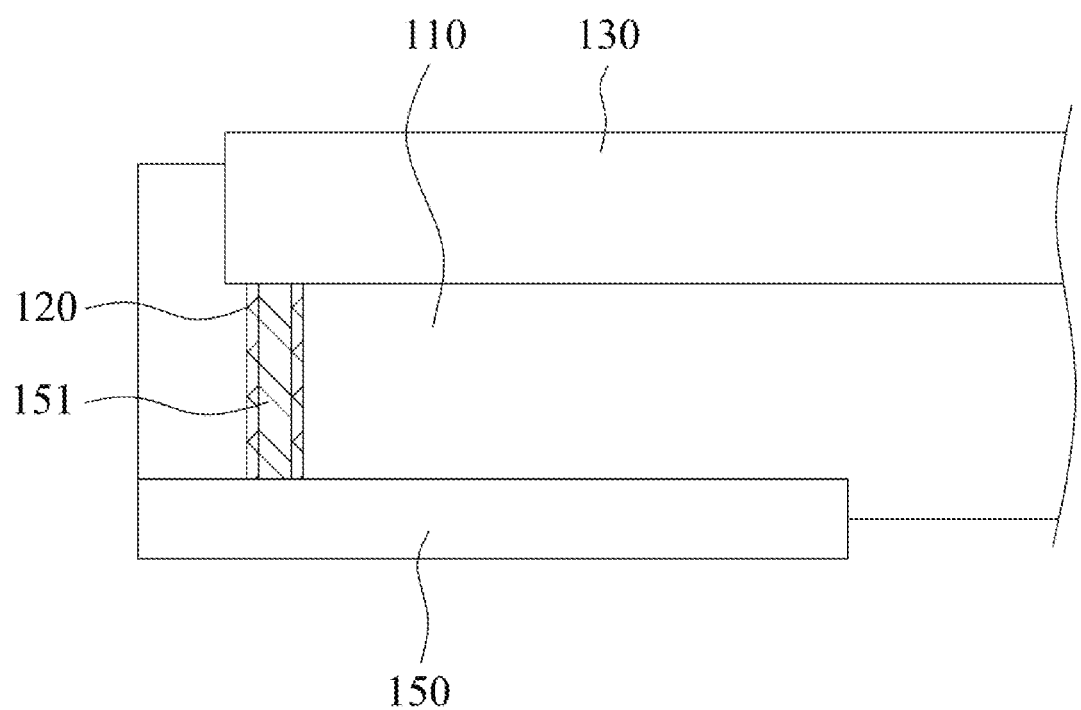

The printed circuit board 150 is disposed under the frame 110; for example, the printed circuit board 150 can be directly disposed under the frame 110, or, a part of the bottom of the frame 110 is cut and a part of the printed circuit board 150 can be inserted into the frame 110. The printed circuit board 150 can be not in contact with the metal frame 103. The printed circuit board 150 can transmit signals for image display to the display panel 130 through the flexible cable 151. As shown in FIG. 3A, the flexible cable 151 can be electrically connected to the display panel 130 along a surface of the frame 110 through the accommodation space between the metal frame 103 and the frame 110. Alternatively, as shown in FIGS. 3B and 3C, the flexible cable 151 can be electrically connected to the display panel 130 via the through hole 120 of the frame 110 in a vertical direction.

Compared with the structure in which the flexible cable 151 is connected to the display panel 130 along the outside of the frame 110, the structure in which the flexible cable 151 is connected to the display panel 130 via the through hole 120 inside the frame can be prevented the signals transmitted by flexible cable 510 from being interfered because of the frame 110 made by insulative material and the through hole 120 including insulative material disposed on inner wall thereof. When the flexible cable 151 is connected to the display panel through the outside of the frame 110, a protective layer 170 can be disposed on the surface of the flexible cable 151 to prevent from signal interference.

Figure 3D:
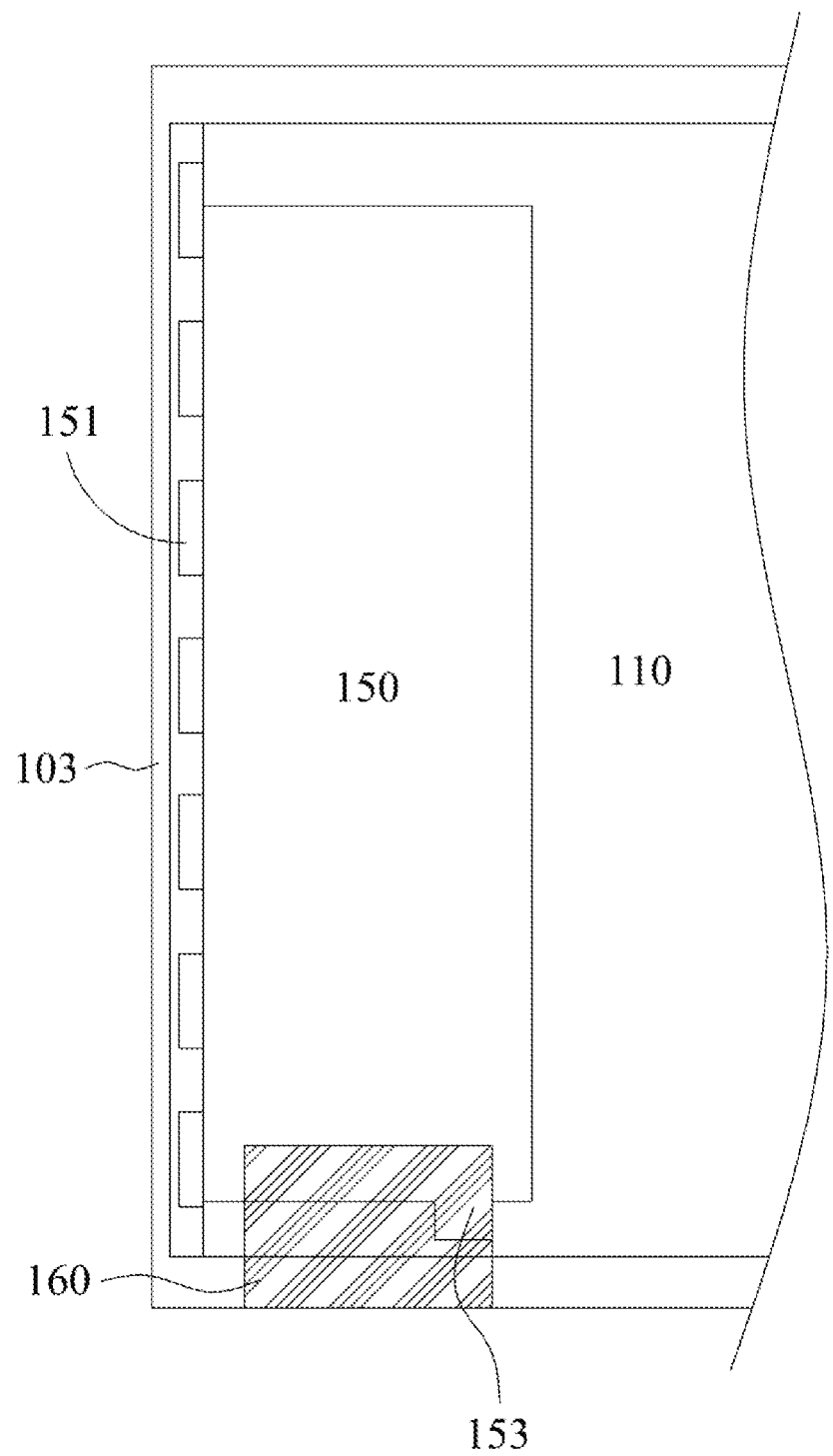
FIG. 3D is a schematic structural view of a part of a bottom of a display device of an embodiment the present disclosure.

As shown in FIG. 3D, the printed circuit board 150 can include a grounding terminal 153. Optionally, the ground terminal 153 can be extended outwardly from an edge of the printed circuit board 150, but not disposed on the edge the same as an edge where the flexible cable 151 is disposed, so as to prevent undesired contact therebetween. The display device 10 may include a conductive film 160 electrically connected to the ground terminal 153 of the printed circuit board 150 and the metal frame 103, so that the cumulative charges of the printed circuit board 150 can be moved to the metal frame 103 through the conductive film 160, and then discharged to external environment. The conductive film 160 can be attached with the printed circuit board 150 and the metal frame 103 by adhesive material. Optionally, the conductive film 160 can be a conductive tape having single-sided adhesive property or double-sided adhesive property. The material of the conductive film 160 can be, for example, aluminum foil, copper foil, conductive polymers, but the present disclosure is not limited thereto.

Figure 4A:
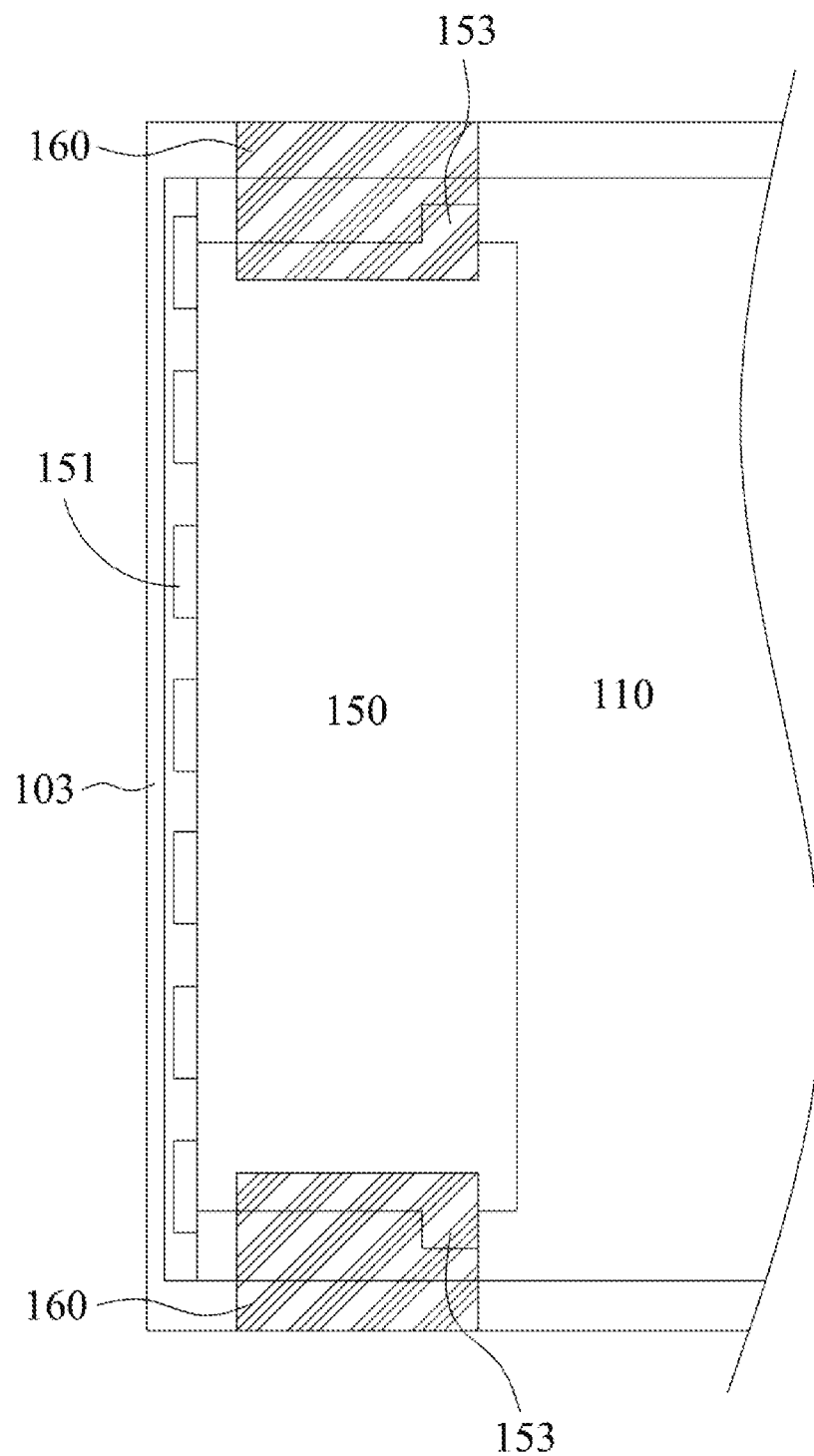
FIGS. 4A and 4B are schematic structural views of a part of a bottom of a display device of an embodiment of the present disclosure.

As shown in FIG. 4A, the printed circuit board 150 can include multiple ground terminals 153 to improve the grounding effect. In other embodiment of the present disclosure, the multiple ground terminals 153 can be disposed on the same edge of the printed circuit board 150 or different edges of the printed circuit board 150, respectively, but not disposed on the edge the same as the edge where the flexible cable 151 is disposed, so as to prevent undesired contact therebetween. When the printed circuit board 150 includes the multiple ground terminals 153, the conductive film 160 can be divided to multiple segments to electrically connect the multiple ground terminals 153 to the metal frame 103, respectively.

Figure 4B:
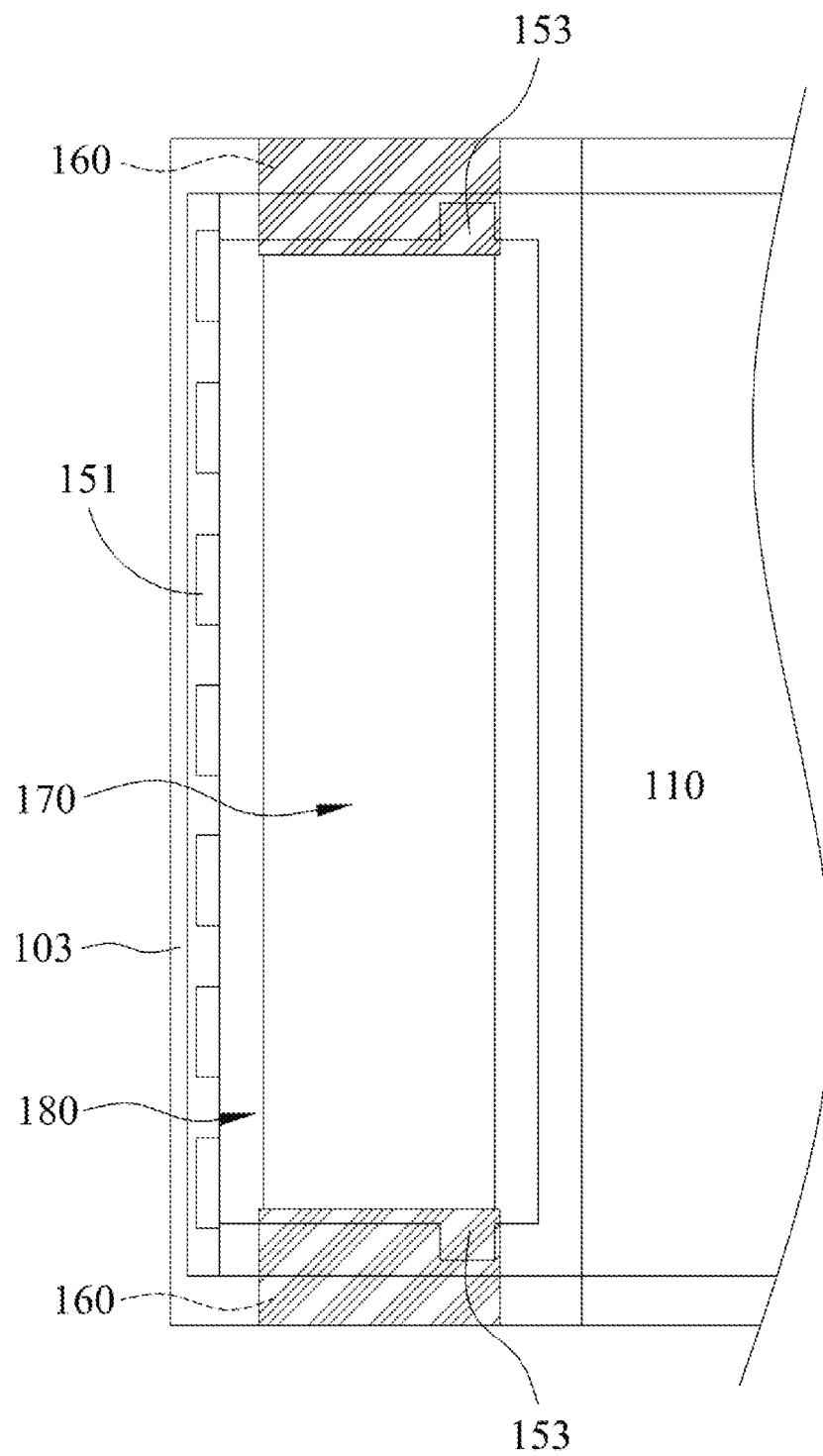
Figure 4C:
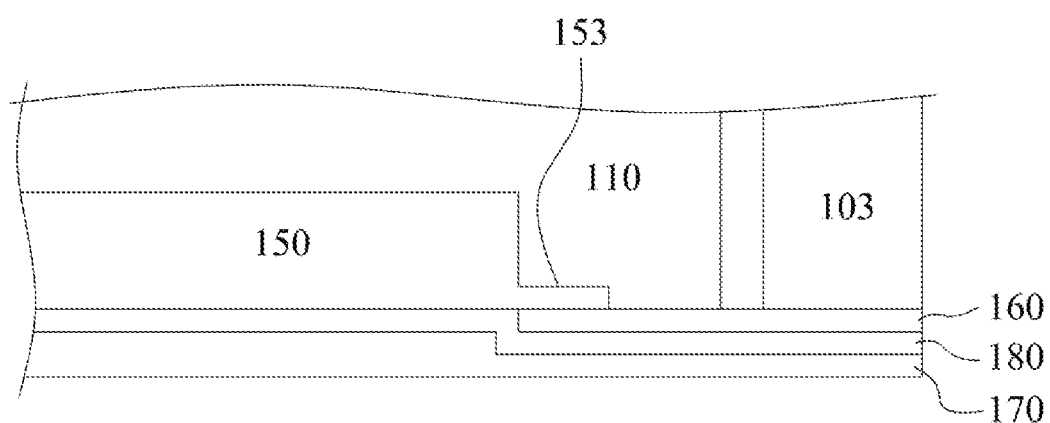
FIG. 4C is a structural side view of a part of a bottom of a display device of an embodiment of the present disclosure.

The display device 900 comprises a protective layer 170 made by insulative material. As shown in FIG. 4B, when the conductive film 160 is a conductive tape having single-sided adhesive property, the protective layer 170 can be disposed to cover the printed circuit board 150, and attached with a peripheral portions of the printed circuit board 150 and the conductive film 160 by an adhesive layer 180, so as to fix the printed circuit board 150 and the conductive film 160. The protective layer 170 can provide electrical shielding effect to isolate the circuits and components on the printed circuit board 150 from external environment, so as to prevent signals transmitted on the printed circuit board 150 from being interfered by external environmental factors to cause abnormal display. FIG. 4C shows a schematic view of a side of the structure. The protective layer 170 can be extended to cover the flexible cable 151, so as to provide electrical shielding effect to prevent the flexible cable 151 from being interfered by the external environmental factors. Furthermore, the protective layer 170 can cover the flexible cable 151 and also fix the flexible cable 151 by adhesive material.

According above contents, the liquid crystal display device of the embodiment of the present disclosure, and the grounding device formed by the printed circuit board, the metal frame, the conductive film and the protective layer of the embodiments can effectively solve the problem of the conventional solution. In the conventional solution, the contact spring is used to electrically connect the ground terminal to the metal frame. Compared with the conventional solution; in contrast, in the embodiment of the present disclosure, only the frame 110 and the protective top side frame 102 having insulative material are in contact with the display panel 130, so that the charges transmitted to the metal frame 103 through the conductive film 160 do not affect the display panel 130, and the charges can also be discharged to external environment. Furthermore, using the conductive film 160 with adhesive property to replace the screw and the contact spring can reduce some steps of the manufacturing process and save the space occupied by the screw and the contact spring, thereby facilitating to manufacture more compact liquid crystal display device. On the other hand, in the present disclosure, the through hole 120 of the frame 110 can be used to prevent the signals from being interfered when the flexible cable 151 is not provided with the protective layer 170. Forming the through hole may result in more steps in the manufacturing process, but the material of the through hole 120 of the frame 110 can provide higher protection than the protective layer 170.

Besides above-mentioned embodiments, the user can optimize some devices of the display device upon actual condition and demand, so as to improve advantages of the present disclosure. Exemplary illustrations of different embodiments are described below.

Figure 4D:
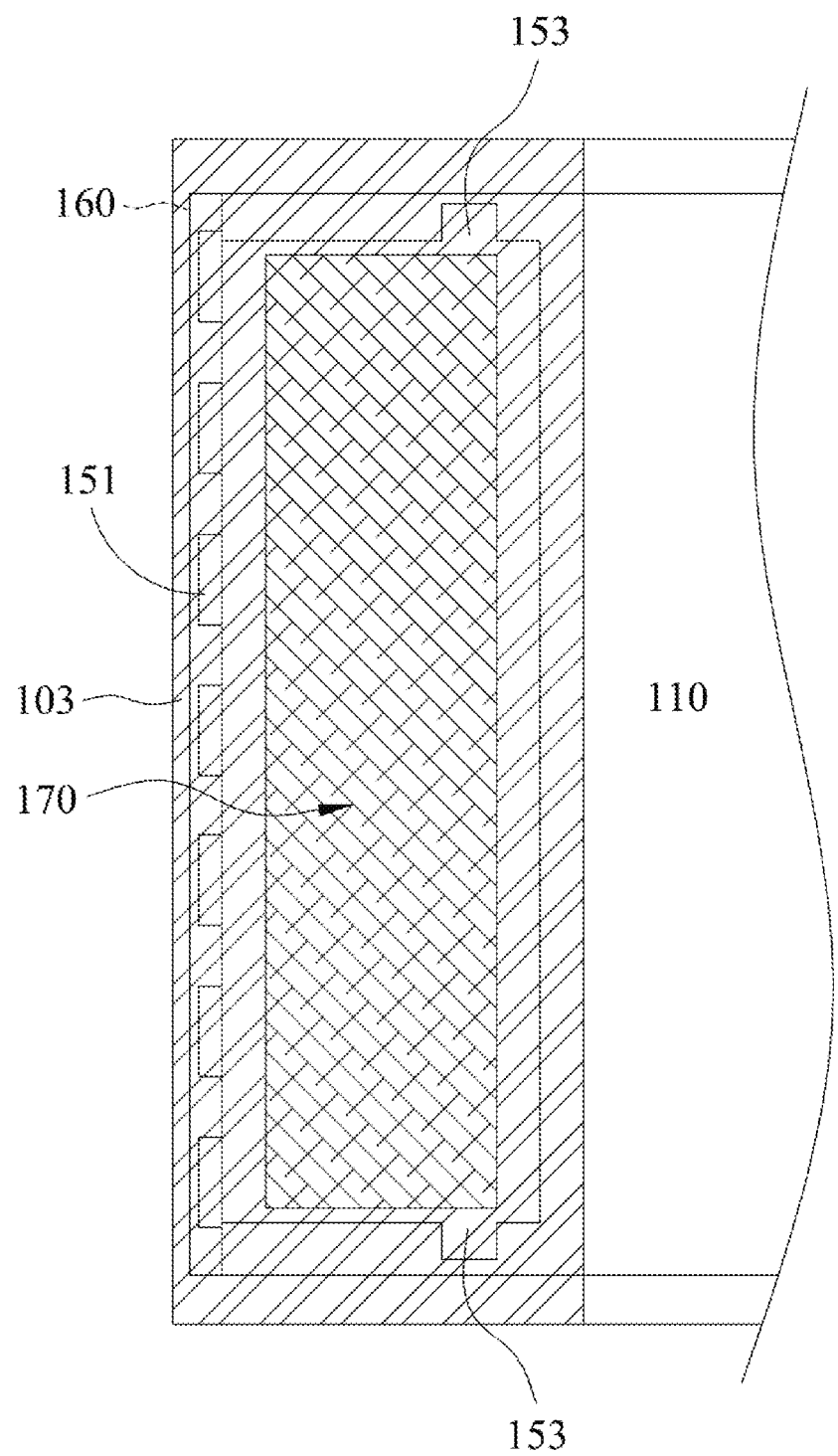
FIG. 4D is a schematic structural view of a part of a bottom of a display device of an embodiment of the present disclosure.
Figure 4E:
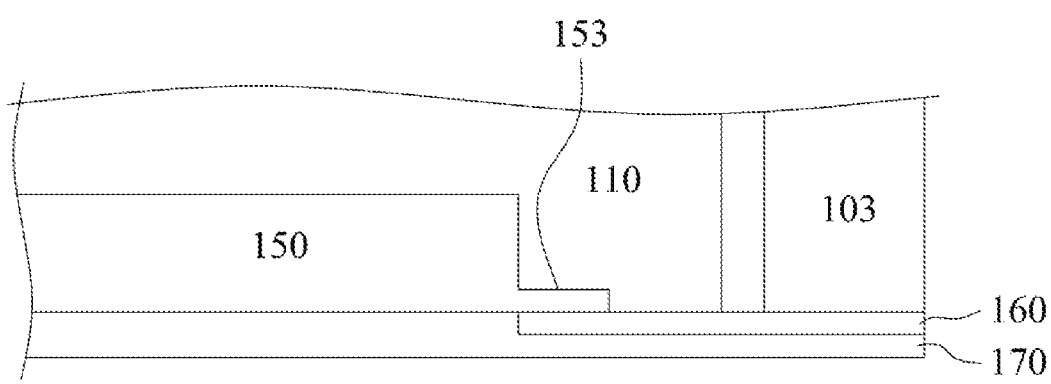
FIG. 4E is a structural side view of a part of a bottom of a display device of an embodiment of the present disclosure.

In an embodiment, the conductive film 160 can be optimized. For example, the conductive film 160 with double-sided adhesive property can be used to replace the conductive film 160 with single-sided adhesive property, other devices and components of this embodiment are the same as that of aforementioned embodiments. As shown in FIG. 4D, when the conductive film 160 is the conductive tape with double-sided adhesive property, the conductive film 160 can be electrically connected to the ground terminal 153 and the metal frame 103, and the conductive film 160 can also be adhered on the peripheral portion of the printed circuit board 150. The protective layer 170 can be adhered on the printed circuit board 150, the ground terminal 153 and the metal frame 103 by using adhesive property of the naked surface of the conductive film 160. Compared with the manner of using the conductive film 160 with single-sided adhesive property, the manner of using the conductive film 160 with double-sided adhesive property to replace the adhesive layer 180 can reduce a thickness of the entire structure, thereby omitting the steps of disposing the adhesive layer 180 in the manufacturing process of the liquid crystal display device. The FIG. 4E shows a schematic view of a side of the structure.

Figure 5:
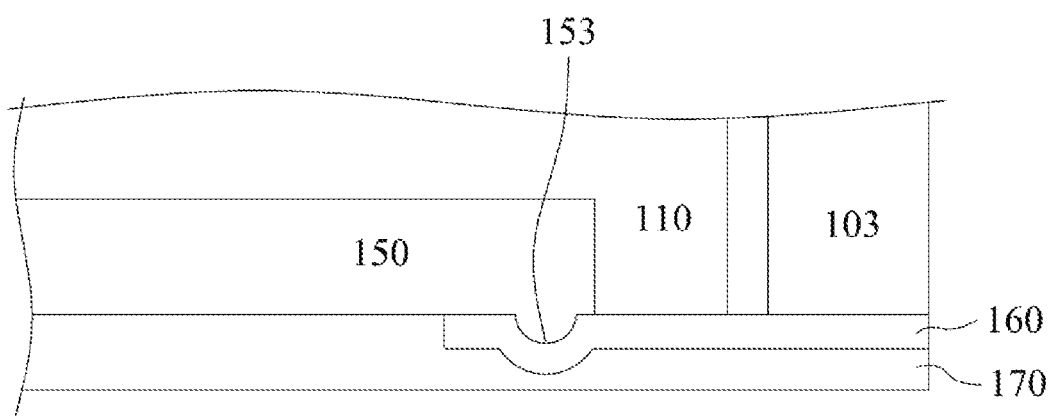
FIG. 5 is a structural side view of a part of a bottom of a display device of an embodiment of the present disclosure.

In other embodiment, the ground terminal 153 can be optimized; for example, the ground terminal 153 can be disposed on a lower surface of the printed circuit board 150 and not extended outwardly from the edge of the printed circuit board, and other devices and components of this embodiment are the same as that of aforementioned other embodiments. As shown in FIG. 5, the conductive film 160 is a conductive tape with flexibility, so that the positions of the conductive film 160 and the protective layer 170 do not need to change for the ground terminal disposed on the lower surface of the printed circuit board 150. This disposal manner can reduce difficulty in manufacturing the ground terminal 153.

Figure 6:
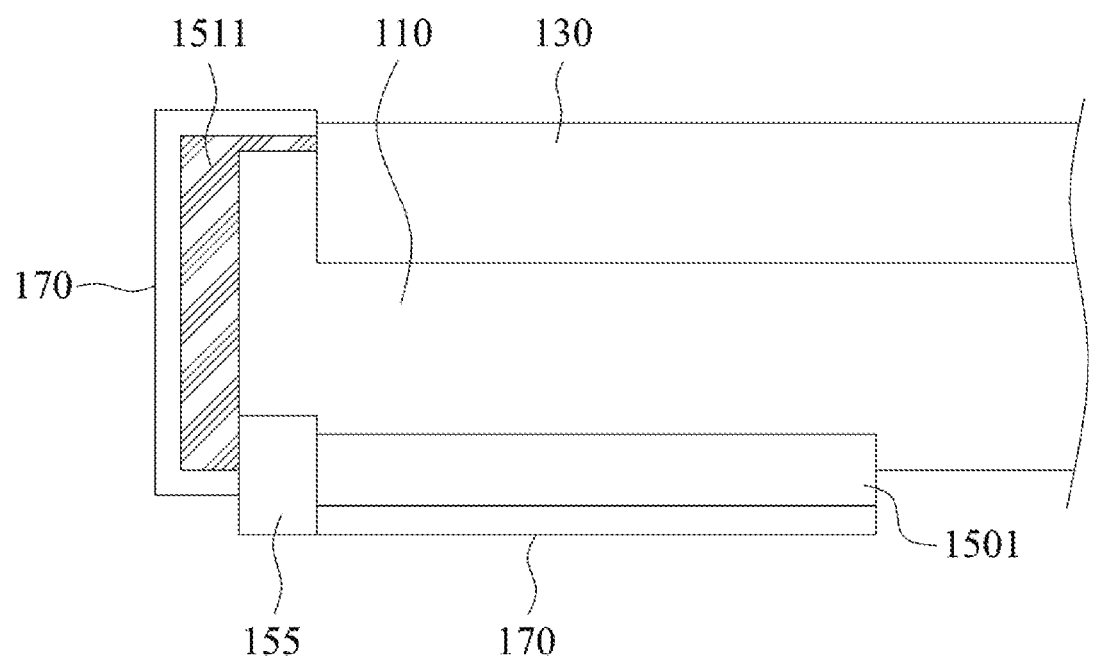
FIG. 6 is a schematic structural view of a part of a liquid crystal display device of an embodiment of the present disclosure.

In an embodiment, the printed circuit board 150, the flexible cable 151 and the protective layer 170 can be optimized; for example, an insulative connection part 155 can be added in this embodiment, other devices and components are the same as that of aforementioned embodiments. As shown in FIG. 6, the flexible cable having insulative protective material covering on a surface thereof can be used to replace the flexible cable 151, and such flexible cable is defined as the surface insulation cable 1511 in this embodiment. The insulative connection part 155 is disposed at a distal end of the surface insulation cable 1511 where the surface insulation cable 1511 is electrically connected to the printed circuit board 150. The insulative connection part 155 includes an insulative outer shell, a port structure and a hollow part. The port structure is disposed in the hollow part and configured to fix with and electrically connect to other component. Furthermore, the printed circuit board 1501 having the port structure can be used to replace the printed circuit board 150, and the printed circuit board 1501 can be electrically connected to the surface insulation cable 1511 through the port structure thereof. As a result, the protective layer 170 can be disposed on the printed circuit board 1501 and the conductive film 160 only and not be extended to cover the surface insulation cable 1511. The surface insulation cable 1511 is provided with insulative protective material formed on the surface thereof to prevent other interference, and the insulative connection part 155 can reinforce the connection between the cable and the printed circuit board. The insulative outer shell can be made by insulative material having rigidity higher than that of the protective layer 170, so as to protect the connection part which is relatively weak and further prevent the connection part from falling or being damaged because of collision or other factor during process. Furthermore, the insulative outer shell can provide higher protection, so that the lifetime of the liquid crytal display device can be extended.

Figure 7:
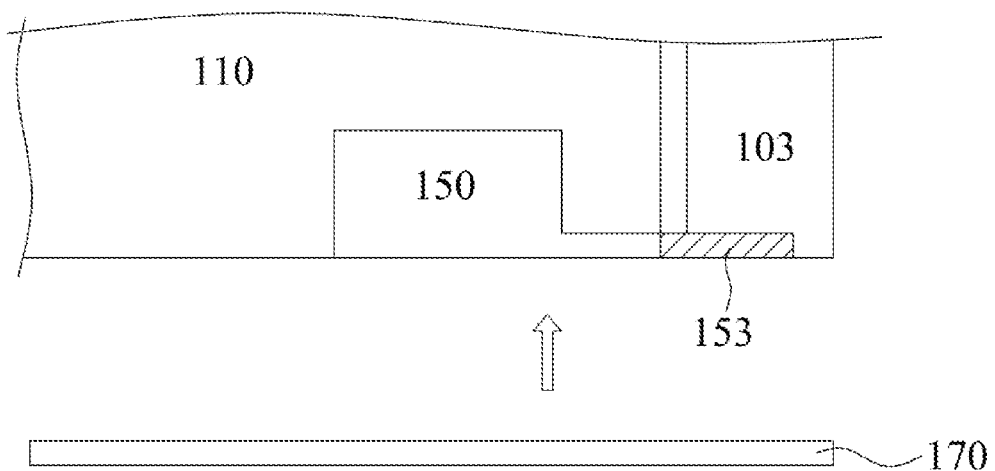
FIG. 7 is a structural side view of a part of a bottom of a liquid crystal display device of an embodiment of the present disclosure.

In an embodiment, he ground terminal 153 of the printed circuit board 150 can be optimized; for example, the ground terminal 153 can be disposed on the edge of the printed circuit board 150 and extended outwardly to out of a boundary of the frame 110, and other devices and components of this embodiment are the same as that of aforementioned embodiments. As shown FIG. 7, the ground terminal 153 is extended outwardly from the edge of the printed circuit board 150 to directly contact the metal frame 103. Under this condition, the cumulative charges of the printed circuit board 150 can be moved to the metal frame 103 through the ground terminal 153 without using the conductive film 160. Optionally, the metal frame 103 can be provided with a socket matching the ground terminal 153, so that the ground terminal 153 can be directly inserted into and fixed with the socket, to directly contact the metal frame 103 for electrical connection. Optionally, the part of the printed circuit board 150 protruded out of the frame 110 only includes the ground terminal 153 without other circuit. After the ground terminal 153 is electrically connected to the metal frame 103, the protective layer 170 is disposed to provide electrical shielding effect.

Figure 8A:
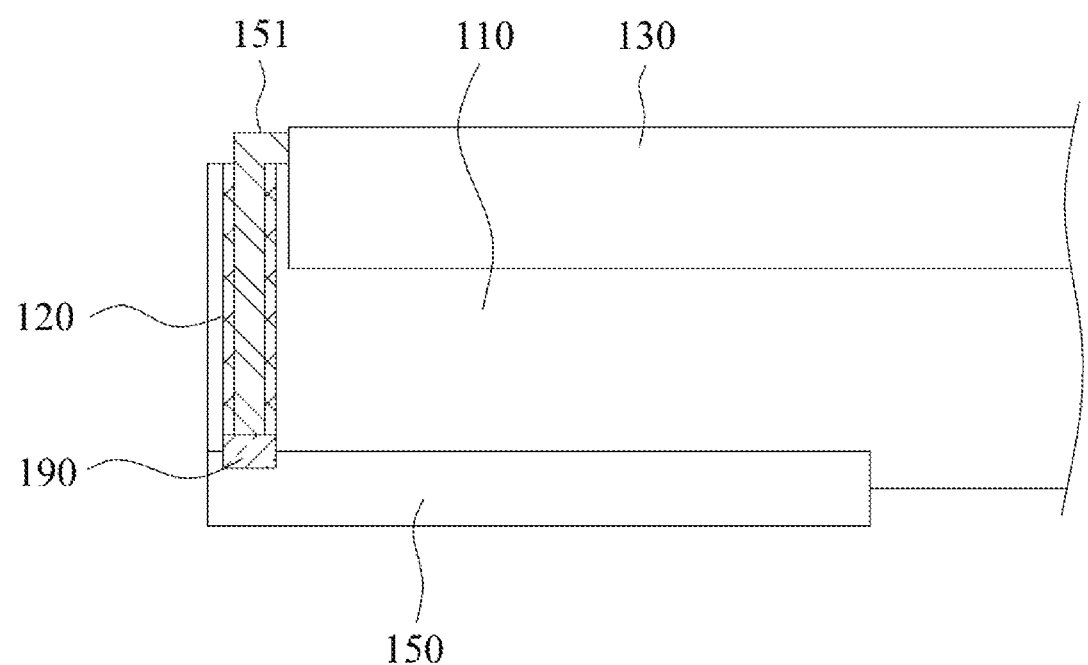
FIGS. 8A and 8B are schematic structural views of a part of a liquid crystal display device of an embodiment of the present disclosure.
Figure 8B:
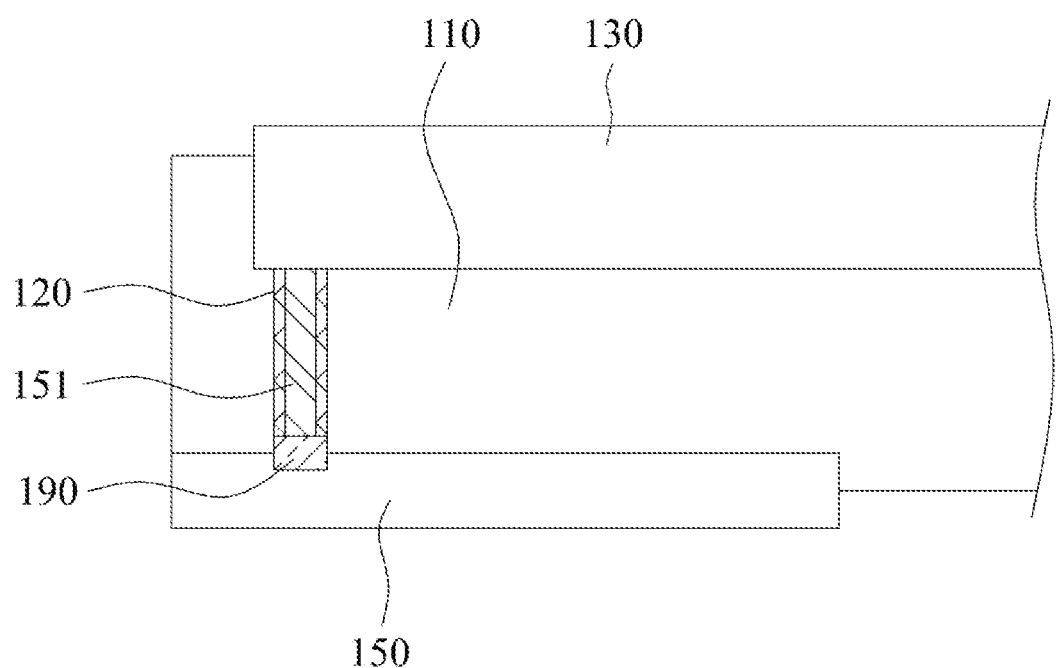

In another embodiment, the structures of the printed circuit board 150, the flexible cable 151 and the through hole 120 can be optimized. As shown in FIGS. 8A and 8B, the conductive part 190 is disposed on a back side of the printed circuit board 150, that is, the back side of the printed circuit board 150 is a side of the printed circuit board 150 facing the frame 110. Furthermore, the opening of the through hole 120 facing the printed circuit board 150 can be designed to be in specific shape. Optionally, the specific shape matches the conductive part 190. When the printed circuit board 150 is disposed on the lower surface of the frame 110, the conductive part 190 can be fixed in the through hole and the flexible cable 151 can pass through the conductive part 190 and the through hole 120 to electrically connect the printed circuit board 150 with the display panel 130. Under this condition, the connection part between the printed circuit board 150 and the flexible cable 151 is fully disposed inside the through hole 120 without using the protective layer 170 to insulate the flexible cable 151 from external environment. Preferably, the display panel can be LCD display panel, OLED display panel, QLED display panel, curved display panel or other display panel.

The present disclosure disclosed herein has been described by means of specific embodiments. However, numerous modifications, variations and enhancements can be made thereto by those skilled in the art without departing from the spirit and scope of the disclosure set forth in the claims.

What is claimed is:

1. A display device, comprising:
a display panel;
a frame made by insulative material, wherein the display panel is disposed on the frame, and the frame comprises a through hole in communication with a top and a bottom thereof;
a metal frame configured to enclose the frame, and comprising a hollow part configured to accommodate the display panel;
a printed circuit board disposed under the frame and not in contact with the metal frame, and electrically connected to the display panel via the through hole and a flexible cable;
a conductive film attached with and electrically connected to a ground terminal of the printed circuit board and the metal frame; and
a protective layer made by the insulative material and configured to cover on the printed circuit board and attach with a peripheral portion of the printed circuit board by adhesive material, so as to fix the printed circuit board for electrical shielding;
wherein the ground terminal is extended from an edge of the printed circuit board to a side of the metal frame.

2. The display device according to claim 1, wherein the ground terminal is disposed on a lower surface of the printed circuit board.

3. The display device according to claim 1, wherein the conductive film has single-sided adhesive property.

4. The display device according to claim 3, wherein the protective layer is attached with the conductive film by adhesive material, to cover the conductive film.

5. The display device according to claim 1, wherein the conductive film has double-sided adhesive property.

6. The display device according to claim 5, wherein the conductive film is directly attached with and covered by the protective layer.

7. The display device according to claim 6, wherein the conductive film with double-sided adhesive property is attached with the peripheral portion of the printed circuit board to serve as the adhesive material.

8. The display device according to claim 7, wherein the printed circuit board is attached with and covered by the protective layer through the conductive film with double-sided adhesive property.

9. A grounding device of a display device, comprising:
a metal frame configured to enclose a frame of the display device and comprising a hollow part configured to accommodate a display panel of the display device;
a ground terminal disposed on a lower surface of a printed circuit board or extended from an edge of the printed circuit board to a side of the metal frame;
a conductive film attached with and electrically connected to the ground terminal of the printed circuit board and the metal frame; and
a protective layer made by insulative material and configured to cover the printed circuit board and attach with a peripheral portion of the printed circuit board by adhesive material, so as to fix the printed circuit board for electrical shielding;
wherein the printed circuit board is electrically connected to the display panel via a through hole of the frame and a flexible cable;
wherein the conductive film has double-sided adhesive property;
wherein the conductive film is directly attached with and covered by the protective layer;
wherein the conductive film with double-sided adhesive property is attached on the peripheral portion of the printed circuit board to serve as the adhesive material.

10. The grounding device according to claim 9, wherein the conductive film has single-sided adhesive property.

11. The grounding device according to claim 10, wherein the protective layer is attached with the conductive film by adhesive material to cover the conductive film.

12. The grounding device according to claim 9, wherein the printed circuit board is attached with and covered by the protective layer through the conductive film with double-sided adhesive property.

13. A display device, comprising:
a display panel;
a frame made by insulative material and comprising a through hole in communication with a top and a bottom thereof, wherein the display panel is disposed on the frame;

a metal frame configured to enclose the frame and comprising a hollow part configured to accommodate the display panel;

a printed circuit board disposed under the frame and not in contact with the metal frame, and electrically connected to the display panel via the through hole and a flexible cable;

a conductive film attached with and electrically connected to a ground terminal of the printed circuit board and the metal frame; and a protective layer made by the insulative material and configured to cover the printed circuit board and attach with a peripheral portion of the printed circuit board by adhesive material, so as to fix the printed circuit board for electrical shielding;

wherein the ground terminal is disposed on a lower surface of the printed circuit board or extended from an edge of the printed circuit board to a side of the frame;

wherein the conductive film has single-sided adhesive property or double-sided adhesive property, and when the conductive film has single-sided adhesive property, the protective layer is attached with the conductive film by the adhesive material to cover the conductive film, and when the conductive film has double-sided adhesive property, the conductive film is attached on the peripheral portion of the printed circuit board to serve as the adhesive material, and the printed circuit board is attached with and covered by the protective layer through the conductive film with double-sided adhesive property.

\* \* \* \* \*